US009473101B2

(12) United States Patent
Chan et al.

(10) Patent No.: US 9,473,101 B2
(45) Date of Patent: Oct. 18, 2016

(54) AMPLIFIER WITH INTEGRAL NOTCH FILTER

(71) Applicant: QUALCOMM Incorporated, San Diego, CA (US)

(72) Inventors: Alan Ngar Loong Chan, San Jose, CA (US); Saihua Lin, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/617,579

(22) Filed: Feb. 9, 2015

(65) Prior Publication Data
US 2016/0233843 A1    Aug. 11, 2016

(51) Int. Cl.
*H03F 3/191* (2006.01)
*H03G 3/30* (2006.01)
*H04B 1/10* (2006.01)
*H03F 1/56* (2006.01)
*H03F 3/193* (2006.01)

(52) U.S. Cl.
CPC ............ *H03G 3/3042* (2013.01); *H03F 1/565* (2013.01); *H03F 3/193* (2013.01); *H04B 1/1036* (2013.01); *H03F 3/191* (2013.01); H03F 2200/165 (2013.01); H03F 2200/213 (2013.01); H03F 2200/216 (2013.01); H03F 2200/225 (2013.01); H03F 2200/267 (2013.01); H03F 2200/294 (2013.01); H03F 2200/451 (2013.01); H03F 2200/492 (2013.01)

(58) Field of Classification Search
CPC ........ H03F 3/193; H03F 1/0277; H03F 1/52; H03F 1/565; H03F 2200/255; H03F 2200/387; H03F 2200/451; H03F 2203/21139; H03F 3/211; H03F 3/16; H03F 3/345; H03F 3/1935; H03F 2200/294; H03F 2200/489; H03F 2200/492; H03F 3/191; H03F 2200/546; H03F 2200/372; H03F 1/48; H03F 1/22; H03F 2200/61
USPC .................................. 330/277, 305, 306, 311
See application file for complete search history.

(56) References Cited

U.S. PATENT DOCUMENTS

| 3,495,183 | A | * | 2/1970 | Doundoulakis | ........... | H03F 1/18 330/277 |
|---|---|---|---|---|---|---|
| 6,232,645 | B1 | | 5/2001 | Belot | | |
| 7,068,104 | B2 | * | 6/2006 | Burns | ....................... | H03F 1/22 330/253 |
| 7,221,218 | B2 | * | 5/2007 | Yang | ....................... | H03F 1/223 330/107 |
| 7,468,638 | B1 | | 12/2008 | Tsai et al. | | |
| 8,314,659 | B2 | * | 11/2012 | McFarthing | .............. | H03F 1/26 330/277 |

(Continued)

OTHER PUBLICATIONS

International Search Report and Written Opinion—PCT/US2015/067727—ISA/EPO—Apr. 19, 2016.

*Primary Examiner* — Khanh V Nguyen
(74) *Attorney, Agent, or Firm* — Paradice and Li LLP

(57) ABSTRACT

An amplifier is disclosed that may include a filter, such as a notch-filter, to filter an output signal provided by the amplifier. The included filter may suppress and/or reduce a gain of the amplifier for a particular range of frequencies. In one embodiment, a frequency response of the filter may be determined by one or more reactive components included within the amplifier. In at least one embodiment, the amplifier may include two or more mutual inductors to reduce the gain of the amplifier when operated at or near a predetermined frequency. In another embodiment, the amplifier may include one or more variable capacitors that may enable the frequency response of the filter to be changed and/or modified.

18 Claims, 5 Drawing Sheets

(56) References Cited

U.S. PATENT DOCUMENTS

| | | | |
|---|---|---|---|
| 8,717,103 B2 * | 5/2014 | Leong | H03F 1/223 330/253 |
| 2003/0206076 A1 | 11/2003 | Hashemi et al. | |
| 2007/0115063 A1 | 5/2007 | Lee et al. | |
| 2008/0088373 A1 | 4/2008 | Hong et al. | |
| 2014/0015614 A1 | 1/2014 | Oliveira et al. | |
| 2014/0097906 A1 * | 4/2014 | Jennings | H03F 3/185 330/306 |
| 2014/0357204 A1 | 12/2014 | Heikkinen et al. | |

* cited by examiner

AMPLIFIER WITH INTEGRAL NOTCH FILTER

TECHNICAL FIELD

The present embodiments relate generally to communication devices, and specifically to amplifiers within communication devices having an integral notch filter.

BACKGROUND OF RELATED ART

Communication devices may transmit and receive communication data through a communication medium. In one example, the communication medium may be a wireless communication medium where communication data is transmitted and received by communication devices according to a wireless communication protocol. Example wireless communication protocols may include IEEE 802.11 protocols and Bluetooth protocols according to the Bluetooth Special Interest Group. In another example, the communication medium may be a wired communication medium where the communication data is transmitted and received according to a wire-based communication protocol. Some example wire-based protocols may include an Ethernet® protocol and/or a Powerline Communications protocol described by the HomePlug 2.0 specification. In yet another example, the communication medium may be a hybrid combination of wired and wireless communication mediums.

Analog signals within communication devices may undergo amplification during various processing operations. For example, an analog signal may be amplified when a communication signal is received from or transmitted to another communication device. In some cases, as an analog signal is amplified, an unwanted signal may be introduced (e.g., added) to the amplified signal. For example, as a first signal is amplified, a second signal that is an unwanted harmonic of the first signal, may also be amplified. The second signal may couple into a sensitive receive and/or transmit circuit and interfere with the transmission and/or reception of the communication data.

Thus, there is a need to improve the amplification of analog signals while suppressing amplification of unwanted signals, and thereby improve the performance of the communication device.

SUMMARY

This summary is provided to introduce in a simplified form a selection of concepts that are further described below in the detailed description. This summary is not intended to identify key features or essential features of the claimed subject matter, nor is it intended to limit the scope of the claimed subject matter.

A configurable amplifier is disclosed. The configurable amplifier may include a first resonant circuit to provide a low impedance circuit path to reduce a gain of the amplifier when operating near a first frequency. The first resonant circuit may include a first parasitic capacitor coupled between a drain terminal of a first transistor and a body terminal of the first transistor, and a first inductor coupled between the body terminal of the first transistor and ground.

A communication device is disclosed. The communication device may include a base-band processor to process communication data, and a configurable amplifier, coupled to the base-band processor, to amplify the communication data. The configurable amplifier may include a first resonant circuit to provide a low impedance circuit path to reduce a gain of the amplifier when operating near a first frequency. The first resonant circuit may include a first parasitic capacitor coupled between a drain terminal of a transistor and a body terminal of the transistor, and a first inductor coupled between the body terminal of the transistor and ground.

An amplifier is disclosed that may include a first inductor of a mutual inductor pair coupled to a gate terminal of a transistor, and a second inductor of the mutual inductor pair coupled between a body terminal of the transistor and ground, the second inductor to reduce a gain of the amplifier.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

The example embodiments are described below in the context of Wi-Fi enabled devices for simplicity only. It is to be understood that the example embodiments are equally applicable for devices using signals of other various wireless standards or protocols (e.g., cellular signals such as LTE, GSM, and UMTS signals). As used herein, the terms "wireless local area network (WLAN)" and "Wi-Fi" can include communications governed by the IEEE 802.11 standards, BLUETOOTH®, HiperLAN (a set of wireless standards, comparable to the IEEE 802.11 standards, used primarily in Europe), and other technologies used in wireless communications (e.g., ZigBee and WiGig). The example embodiments may also be used with wired standards including, for example, Ethernet, PLC/HomePlug, and other technically feasible wired communication standards.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

Figure 1:
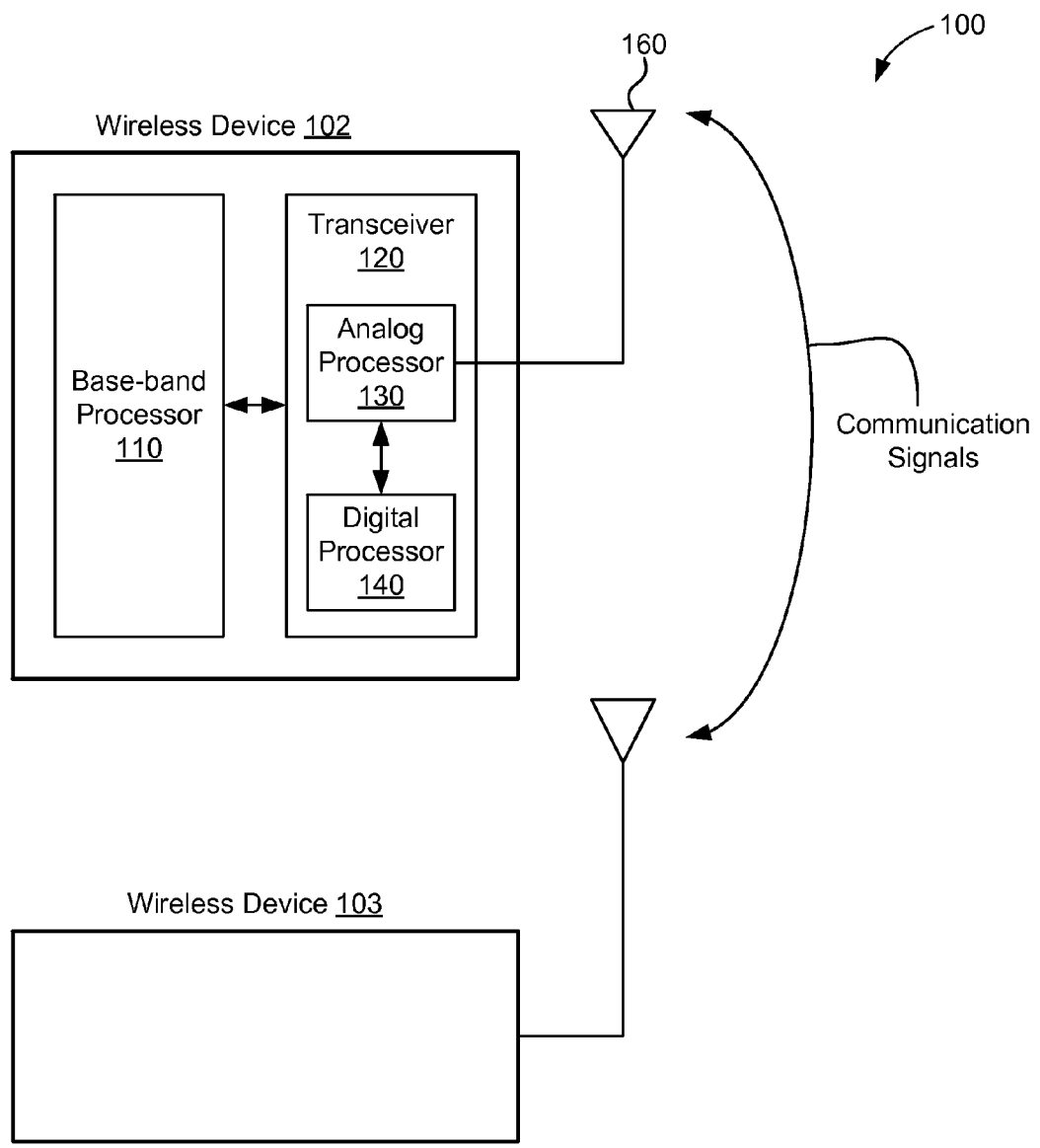
FIG. 1 depicts an example communication system within which example embodiments may be implemented

FIG. 1 depicts an example communication system 100 within which example embodiments may be implemented. Communication system 100 may be a wireless system and may include wireless device 102 and wireless device 103. Although only two wireless devices 102 and 103 are shown for simplicity, communication system 100 may include any number of wireless devices. In other embodiments, communication system 100 may be a wired system and may include wired devices coupled to a wire or cable (not shown for simplicity). In still other embodiments, communication system 100 may be a hybrid system and may include both wireless and wired devices.

Wireless device 102 may include a transceiver 120, a base-band processor 110, and an antenna 160. Although not shown for simplicity, wireless device 102 may include a plurality of antennas. Base-band processor 110 may provide data to be transmitted to and/or receive data from one or more other devices via transceiver 120 and antenna 160. For example, base-band processor 110 may encode and/or decode the communication data for transmission and/or reception by transceiver 120.

Transceiver 120 may include a digital processor 140 and an analog processor 130. Digital processor 140 may receive the communication data from and provide the communication data to base-band processor 110. In some embodiments, the communication data may be processed according to a wireless communication protocol such as Wi-Fi, BLUETOOTH, near-field communication, Zig-Bee, or any other feasible wireless communication protocol. In other embodiments, the communication data may be processed according to a wired protocol such as an Ethernet, Powerline Communication (PLC), or any other feasible wired communication protocol. In still other embodiments, the communication data may be processed according to both a wireless and a wired communication protocol.

In one embodiment, analog processor 130 may be coupled to digital processor 140, and to antenna 160. Analog processor 130 may process communication data to and/or from digital processor 140. For example, analog processor 130 may process communication data from digital processor 140 for transmission through antenna 160 and/or analog processor 130 may process and provide communication data received through antenna 160 to digital processor 140.

One or more analog signals may be amplified within wireless device 102 or wireless device 103. For example, an analog signal, used to transmit or receive a communication signal, may be amplified within analog processor 130 by a configurable amplifier (not shown for simplicity) provided within wireless device 102 and/or wireless device 103. In one embodiment, the configurable amplifier may amplify the analog signal while suppressing unwanted harmonics of the analog signal. Operation of the configurable amplifier is described in more detail below in conjunction with FIGS. 2 and 3.

Figure 2:
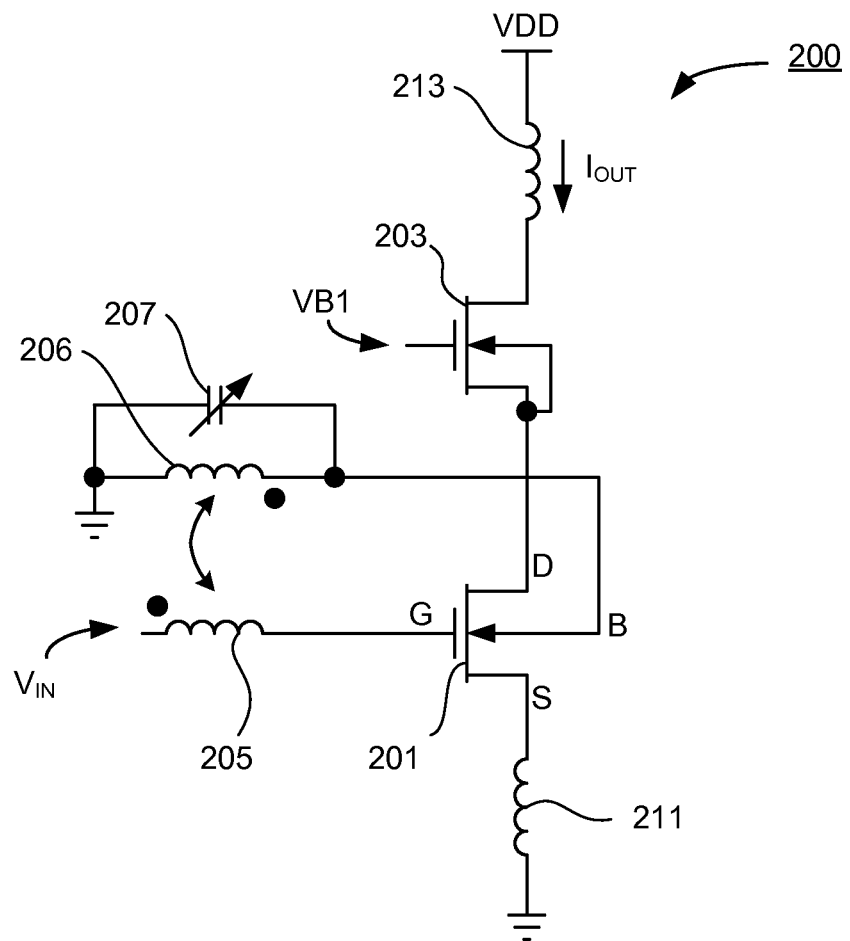
FIG. 2 shows a schematic diagram of a configurable amplifier, in accordance with example embodiments.

FIG. 2 shows a schematic diagram of a configurable amplifier 200, in accordance with example embodiments. Configurable amplifier 200 may include a first transistor 201, a second transistor 203, a first inductor 205, a second inductor 206, a variable capacitor 207, a third inductor 211, and a fourth inductor 213. First inductor 205 may be coupled to a gate terminal (G) of first transistor 201. In some embodiments, an input signal ($V_{IN}$) for configurable amplifier 200 may be a voltage coupled to first inductor 205. A source terminal (S) of first transistor 201 may be coupled to ground through third inductor 211. In some embodiments, third inductor 211 may function as a degeneration inductor and may provide a loss-less (non-resistive) feedback signal for, and may reduce the gain of, first transistor 201.

A drain terminal (D) of first transistor 201 may be coupled to second transistor 203. In some embodiments, second transistor 203 may operate as a cascode load for first transistor 201. For example, second transistor 203 may be configured to operate as a common gate amplifier when a bias voltage VB1 is coupled to a gate terminal of second transistor 203. The common gate amplifier, in turn, may provide a cascode load to first transistor 201. In some embodiments, second transistor 203 may be optional and may be replaced by any other technically feasible circuit element coupled to the drain terminal of first transistor 201. For example, a resistor or an inductor may couple the drain terminal of first transistor 201 to VDD.

In some embodiments, fourth inductor 213 may be coupled to a drain terminal of second transistor 203. Fourth inductor 213 may provide an output load for second transistor 203 by coupling the drain terminal of second transistor 203 to VDD. In some embodiments, an output signal of configurable amplifier 200 may be a current ($I_{OUT}$) through fourth inductor 213.

Persons skilled in the art will recognize that first transistor 201 may be implemented on a substrate. The substrate may also be referred to as the bulk or body of first transistor 201. The terms substrate, body, and bulk may be used interchangeably herein to refer to the substrate of first transistor 201 (or any other suitable material upon which transistor 201 may be formed). In some embodiments, a body terminal (B) (e.g., a connection to the substrate of first transistor 201) may not be coupled directly to ground, but instead may be coupled to ground through one or more reactive elements. As shown in FIG. 2, the body terminal is coupled to ground through second inductor 206 coupled in parallel with variable capacitor 207.

In some embodiments, one or more parasitic capacitors within first transistor 201 may interact with second inductor 206 and/or variable capacitor 207 to reduce a gain of (e.g., affect a frequency response associated with) configurable amplifier 200. For example, a parasitic capacitor (not shown for simplicity) within first transistor 201 may be coupled in series with second inductor 206. A low impedance circuit path provided by the series-coupled LC components may reduce the gain of first transistor 201 when operated at or near a first frequency. In another example, a high impedance circuit path provided by the parallel-coupled LC components may reduce the gain of first transistor 201 when operating at or near a second frequency. In yet another example, first inductor 205 and second inductor 206 may operate as mutual inductors to reduce the gain of first transistor 201 at or near a third frequency. Decreased gain of first transistor 201 at or near predetermined frequencies may effectively filter (e.g., suppress and/or reduce) the output signal from configurable amplifier 200. Operation of first transistor 201 is described in more detail below in conjunction with FIG. 3.

Figure 3:
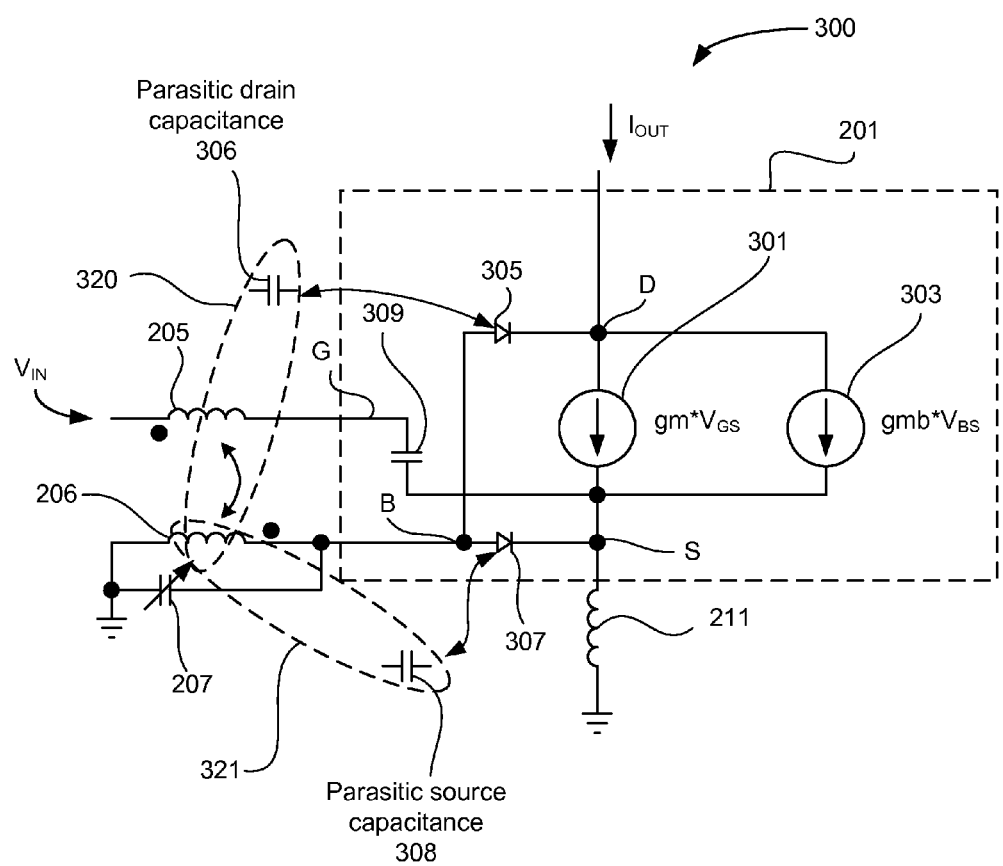
FIG. 3 shows a small signal equivalent circuit of a transistor shown in FIG. 2, in accordance with example embodiments.

FIG. 3 shows a small signal equivalent circuit 300 of first transistor 201 shown in FIG. 2, in accordance with example embodiments. Equivalent circuit 300 may include a first dependent current source 301, a second dependent current source 303, a first body diode 305, and a second body diode 307. Components coupled to first transistor 201 (as shown in FIG. 2) are also shown in FIG. 3. For example, the source terminal of first transistor 201 is coupled to third inductor 211, and the gate terminal of first transistor 201 is coupled to first inductor 205 to receive the input signal $V_{IN}$. In some embodiments, a gate capacitance 309 may be coupled between first inductor 205 and the source terminal of first transistor 201. The drain terminal of first transistor 201 may be coupled to second transistor 203 (not shown for simplicity) and may provide the output signal ($I_{OUT}$). Second inductor 206 may couple the body terminal of first transistor 201 to ground. Variable capacitor 207 may be coupled in parallel with second inductor 206.

First dependent current source 301 may provide a current determined by a voltage between the gate terminal and the source terminal of first transistor 201. In at least one embodiment, the current provided by first dependent current source 301 may be described by eq. 1 below:

$$I=(gm*V_{GS}) \quad (eq. 1)$$

where gm is a transconductance associated with first transistor 201 and $V_{GS}$ is the voltage potential between the gate terminal and the source terminal of first transistor 201.

Second dependent current source 303 may provide a current determined by a voltage between the body terminal and the source terminal of first transistor 201. In at least one embodiment, the current provided by second dependent current source may be described by eq. 2 below:

$$I=(gmb*V_{BS}) \quad (eq. 2)$$

where gmb is a transconductance associated with the body of first transistor 201 and $V_{BS}$ is the voltage potential between the body terminal and the source terminal of first transistor 201. In some embodiments, $I_{OUT}$ may be based on a sum of the currents provided by first dependent current source 301 and second dependent current source 303.

In some embodiments, during operation of first transistor 201, certain P-N junctions within first transistor 201 may form body diodes. For example, a P-N junction between the drain terminal and the body terminal of first transistor 201 may form first body diode 305, and a P-N junction between the source terminal and the body terminal of first transistor 201 may form second body diode 307. A parasitic drain capacitance 306 may be associated with first body diode 305 and a parasitic source capacitance 308 may be associated with second body diode 307.

In at least one embodiment, parasitic drain capacitance 306 and/or parasitic source capacitance 308 may form a first resonant inductor/capacitor (LC) circuit with second inductor 206. For example, second inductor 206 in series with parasitic drain capacitance 306 may form a first resonant LC circuit 320 and second inductor 206 in series with parasitic source capacitance 308 may form a second resonant LC circuit 321. The first resonant LC circuit 320 may provide a relatively low impedance circuit path (due to series-coupled reactive elements) between the drain terminal of first transistor 201 and ground. The relatively low impedance circuit path may exist at or near a signal frequency (e.g., a resonant frequency) determined by a value of parasitic drain capacitance 306 and a value of second inductor 206. Similarly, the second resonant LC circuit 321 may provide a relatively low impedance circuit path between the source terminal of first transistor 201 and ground at or near a signal frequency (e.g., a resonant frequency) determined by a value of parasitic source capacitance 308 and a value of second inductor 206. Since the first resonant LC circuit 320 and the second resonant LC circuit 321 couple the first transistor's drain terminal and source terminal to ground, respectively, gain provided by first transistor 201 may be reduced as the impedance of the first resonant LC circuit 320 and the second resonant LC circuit 321 decreases. In at least one embodiment, inductance values of second inductor 206 may be selected to suppress selected output signal frequencies, such as frequencies that may interfere with sensitive receive and/or transmit circuits within analog processor 130 (see also FIG. 1). For example, an inductance value for second inductor 206 may be selected to suppress an unwanted harmonic of the input signal ($V_{IN}$).

In at least one embodiment, second inductor 206 and variable capacitor 207 may form a third resonant LC circuit. The third resonant LC circuit may provide a relatively high impedance circuit path (due to parallel-coupled reactive elements) between the body terminal of first transistor 201 and ground. Those skilled in the art will appreciate that the relatively high impedance circuit path may exist at or near a signal frequency (e.g., a resonant frequency) determined by a value of the second inductor 206 and a value of the variable capacitor 207. Since the third resonant LC circuit couples the body terminal of first transistor 201 to ground, gain provided by first transistor 201 may be reduced as impedance of the third resonant LC circuit increases. In some embodiments, the value of variable capacitor 207 may be adjusted to change the frequency associated with the increase of the impedance of the third resonant LC circuit. In this manner, particular frequencies may be suppressed when gain of first transistor 201 is reduced. For example, a value of variable capacitor 207 may be selected to suppress an unwanted harmonic of the input signal.

In another embodiment, first inductor 205 and second inductor 206 may be coupled together and may operate as mutual inductors (e.g., a mutual inductor pair). As mutual inductors, a current carried within first inductor 205 may induce a current within second inductor 206. In at least one embodiment, the first inductor 205 may be negatively coupled to the second inductor 206. The negative coupling may cause $V_{BS}$ to oppose $V_{GS}$ (e.g., $V_{BS}=-V_{GS}$). Thus, at certain frequencies, a notch filter may be formed. Equating eq. 1 to eq. 2 and substituting $V_{BS}=-V_{GS}$:

$$(gm*V_{GS})=(gmb*V_{BS})=(gmb*-V_{GS}) \quad (eq. 3)$$

Thus, at some operating points, the output current from first dependent current source 301 (gm*$V_{GS}$) may cancel the output current from second dependent current source 303 (gmb*$-V_{GS}$). When the output currents of the dependent current sources 301 and 303 cancel, gain provided by first transistor 201 may be reduced, effectively filtering the output from first transistor 201. Explained in another manner, currents induced within second inductor 206 may oppose current flow from the body terminal of first transistor 201 and ground. The opposed current flow may reduce the gain associated with first transistor 201.

In some embodiments, the resonant frequencies of the first resonant LC circuit 320, the second resonant LC circuit 321, and the third resonant LC circuit may be similar to one another. In such an embodiment, the gain of configurable amplifier 200 may be reduced at or near a common resonant frequency. In other embodiments, the resonant frequencies of the first resonant LC circuit 320, the second resonant LC circuit 321, and the third resonant LC circuit may each be different from each other. In such an embodiment, the gain of configurable amplifier 200 may be reduced at or near three distinct frequencies.

Figure 4:
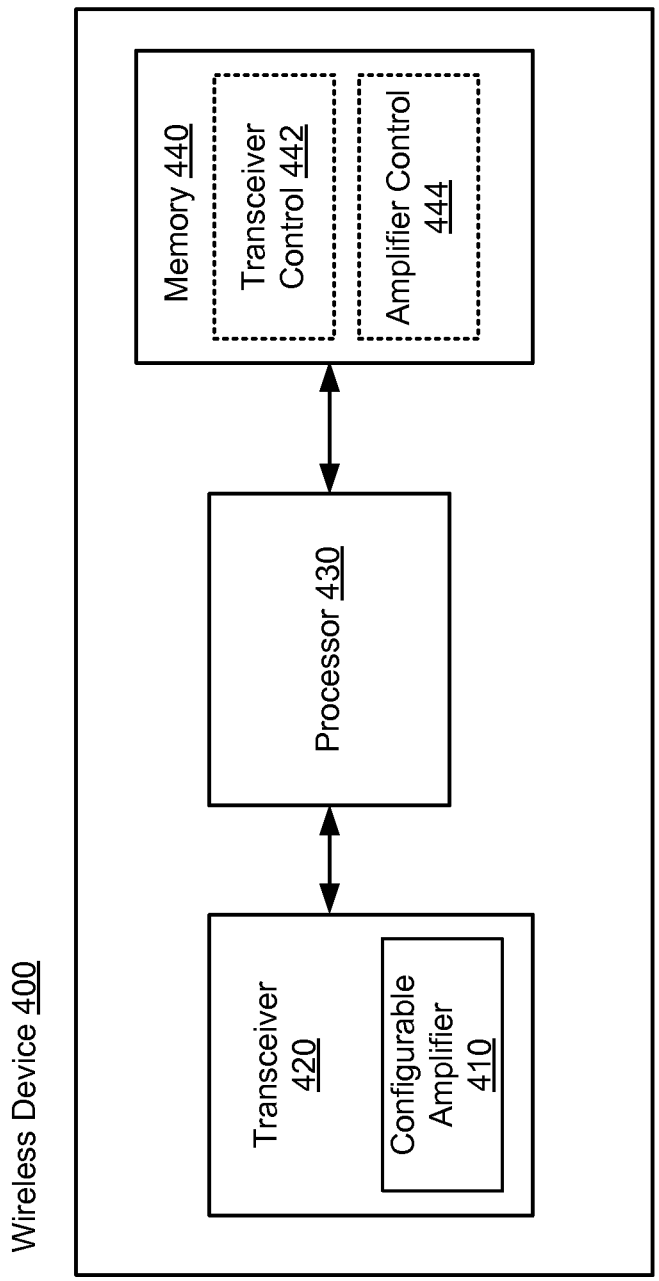
FIG. 4 shows a wireless device that is one embodiment of the wireless devices of FIG. 1.

FIG. 4 shows a wireless device 400 that is one embodiment of the wireless devices 102 and 103 of FIG. 1. The wireless device 400 may include a transceiver 420, a processor 430, and a memory 440. The transceiver 420 may transmit signals to and receive signals from other wireless devices. In at least one embodiment, transceiver 420 may include a configurable amplifier 410 that may be an embodiment of configurable amplifier 200 of FIG. 2.

Memory 440 may include a non-transitory computer-readable storage medium (e.g., one or more nonvolatile memory elements, such as EPROM, EEPROM, Flash memory, a hard drive, etc.) that may store the following software modules:

a transceiver control module 442 to control transceiver 420 to transmit and receive communication signals in accordance with one or more communication protocols; and an amplifier control module 444 to control configurable amplifier 410 to amplify one or more analog signals within transceiver 420.

Each software module includes program instructions that, when executed by processor 430, may cause the wireless device 400 to perform the corresponding function(s). Thus, the non-transitory computer-readable storage medium of memory 440 may include instructions for performing all or a portion of the operations of FIG. 5.

Processor 430, which is coupled to transceiver 420, and memory 440, may be any one or more suitable processors capable of executing scripts or instructions of one or more software programs stored in wireless device 400 (e.g., within memory 440).

Processor 430 may execute transceiver control module 442 to configure transceiver 420 to receive and/or transmit one or more communication signals in accordance with a communication protocol. For example, transceiver control module 442 may receive and/or transmit communication signals according to the IEEE 802.11 specification, a BLUETOOTH specification according to the Bluetooth Special Interest Group, a WiGig® specification, a ZigBee specification or any other technically feasible communication protocol.

Processor 430 may execute amplifier control module 444 to control operation of configurable amplifier 410. In some embodiments, configurable amplifier 410 may include a variable capacitor 207 that may control, at least in part, a frequency response associated with configurable amplifier 410. For example, configurable amplifier 410 may include variable capacitor 207 that may control, in part, a frequency response of a notch filter included within configurable amplifier 410. In other embodiments, variable capacitor 207 may be associated with a high-pass, low-pass, or a band-pass filter included within configurable amplifier 410. Thus, controlling variable capacitor 207 via amplifier control module 444 may dynamically change the frequency response of configurable amplifier 410 and thereby dynamically suppress one or more signals that may interfere with the reception or transmission of communication signals by wireless device 400.

Figure 5:
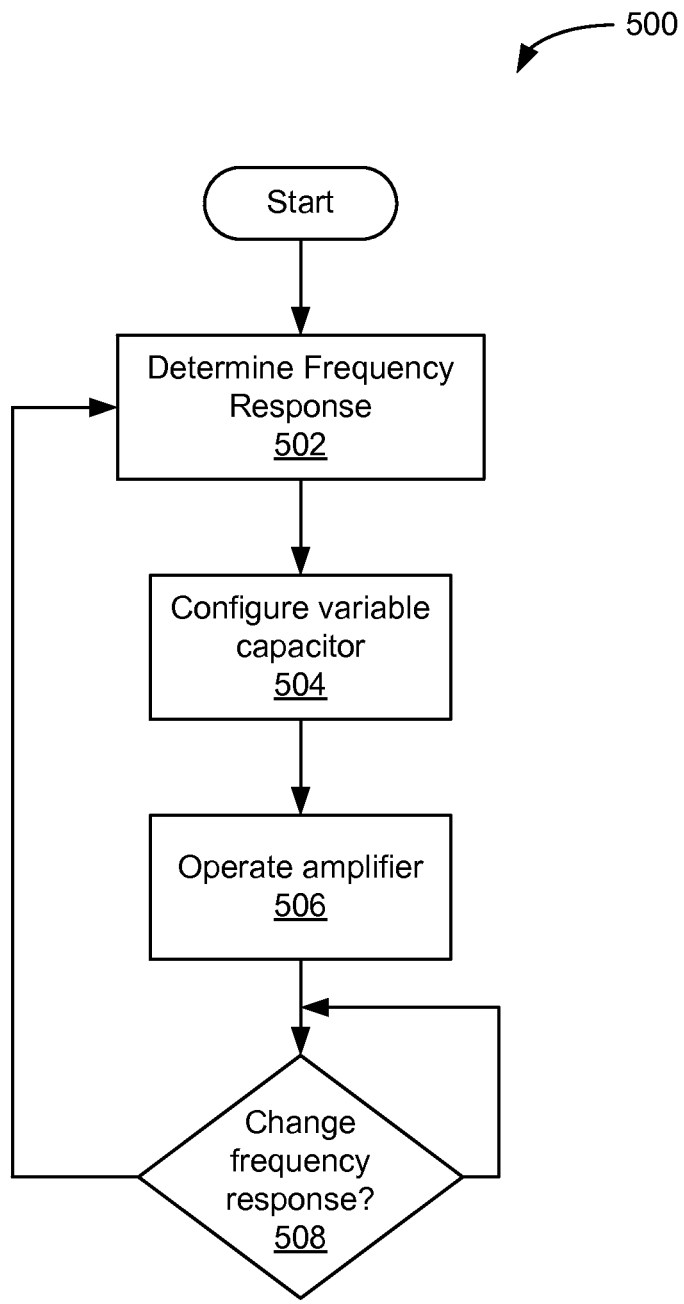
FIG. 5 shows an illustrative flow chart depicting an exemplary operation for operating a configurable amplifier, in accordance with example embodiments.

FIG. 5 shows an illustrative flow chart depicting an exemplary operation 500 for operating configurable amplifier 200, in accordance with example embodiments. Some embodiments may perform the operations described herein with additional operations, fewer operations, operations in a different order, operations in parallel, and/or some operations differently. Referring also to FIG. 2, a frequency response associated with configurable amplifier 200 is determined (502). In some embodiments, the frequency response of configurable amplifier 200 may be selected to suppress unwanted harmonics associated with $V_{IN}$.

Next, a variable capacitor associated with configurable amplifier 200 is configured (504). In some embodiments, configurable amplifier 200 may include variable capacitor 207 whose capacitance may affect an associated frequency response. For example, variable capacitor 207 may affect a frequency response of a notch filter included within configurable amplifier 200. In other embodiments, variable capacitor 207 may be associated with a high-pass, low-pass, or a band-pass filter included within configurable amplifier 200.

Next, configurable amplifier 200 is operated (506). For example, the input signal $V_{IN}$ may be received by configurable amplifier 200, and an output signal $I_{OUT}$ may be generated in response to $V_{IN}$. In at least one embodiment, unwanted harmonics of $V_{IN}$ may be suppressed within configurable amplifier 200 in accordance with the frequency response of configurable amplifier 200. Next, a change of the frequency response associated with configurable amplifier 200 is determined (508). If the frequency response associated with configurable amplifier 200 is not to change, then operations return to 508. If, on the other hand, the frequency response associated with configurable amplifier 200 is to change, then operations proceed to 502.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A configurable amplifier, comprising:
    a first resonant circuit to provide a low impedance circuit path to reduce a gain of the configurable amplifier when operating near a first frequency, the first resonant circuit comprising:
        a first parasitic capacitor coupled between a drain terminal of a first transistor and a body terminal of the first transistor;
        a first inductor coupled between the body terminal of the first transistor and ground; and
        a second inductor to couple with the first inductor to reduce the gain of the configurable amplifier.

2. The configurable amplifier of claim 1, wherein the first frequency is based, at least in part, on a capacitance of the first parasitic capacitor and an inductance of the first inductor.

3. The configurable amplifier of claim 1, wherein the second inductor is coupled to a gate terminal of the first transistor.

4. The configurable amplifier of claim 1, wherein the second inductor is to receive an input signal for the configurable amplifier.

5. The configurable amplifier of claim 1, further comprising:
    a second resonant circuit to provide a high impedance circuit path to reduce the gain of the configurable amplifier when operating near a second frequency, the second resonant circuit comprising:
        a variable capacitor coupled between the body terminal of the first transistor and ground, wherein the variable capacitor is coupled in parallel with the first inductor.

6. The configurable amplifier of claim 5, wherein the second frequency is based, at least in part, on a capacitance of the variable capacitor.

7. The configurable amplifier of claim 1, further comprising:
- a second resonant circuit to provide a low impedance circuit path to reduce the gain of the configurable amplifier when operating near a second frequency, the second resonant circuit comprising:
  - the first inductor; and
  - a second parasitic capacitor coupled between a source terminal of the first transistor and the body terminal.

8. The configurable amplifier of claim 7, wherein the second frequency is based, at least in part, on a capacitance of the second parasitic capacitor and an inductance of the first inductor.

9. The configurable amplifier of claim 1, further comprising:
- a second transistor coupled to the drain terminal of the first transistor to operate as a cascode load for the first transistor.

10. A communication device, comprising:
- a base-band processor to process communication data; and
- a configurable amplifier, coupled to the base-band processor, to amplify the communication data, the configurable amplifier comprising:
  - a first resonant circuit to provide a low impedance circuit path to reduce a gain of the configurable amplifier when operating near a first frequency, the first resonant circuit comprising:
    - a first parasitic capacitor coupled between a drain terminal of a transistor and a body terminal of the transistor;
    - a first inductor coupled between the body terminal of the transistor and ground; and
    - a second inductor to couple with the first inductor to reduce the gain of the configurable amplifier.

11. The communication device of claim 10, wherein the first frequency is based, at least in part, on a capacitance of the first parasitic capacitor and an inductance of the first inductor.

12. The communication device of claim 10, wherein the second inductor is coupled to a gate terminal of the transistor.

13. The communication device of claim 10, further comprising:
- a second resonant circuit to provide a high impedance circuit path to reduce the gain of the configurable amplifier when operating near a second frequency, the second resonant circuit comprising:
  - a variable capacitor coupled between the body terminal of the transistor and ground, wherein the variable capacitor is coupled in parallel with the first inductor.

14. The communication device of claim 13, wherein the second frequency is based, at least in part, on a capacitance of the variable capacitor.

15. The communication device of claim 10, further comprising:
- a second resonant circuit to provide a low impedance circuit path to reduce the gain of the configurable amplifier when operating near a second frequency, the second resonant circuit comprising:
  - the first inductor; and
  - a second parasitic capacitor coupled between a source terminal of the transistor and the body terminal.

16. The communication device of claim 15, wherein the second frequency is based, at least in part, on a capacitance of the second parasitic capacitor and an inductance of the first inductor.

17. An amplifier, comprising:
- a first inductor of a mutual inductor pair coupled to a gate terminal of a transistor; and
- a second inductor of the mutual inductor pair coupled between a body terminal of the transistor and ground, the second inductor to reduce a gain of the amplifier.

18. The amplifier of claim 17, wherein the second inductor is to oppose a current flow between the body terminal and ground based, at least in part, on a current carried by the first inductor.

* * * * *